(12) United States Patent
Moehlmann et al.

(10) Patent No.: US 12,063,045 B2
(45) Date of Patent: Aug. 13, 2024

(54) FEEDBACK SYSTEM MONITORING

(71) Applicant: NXP B.V., Eindhoven (NL)

(72) Inventors: Ulrich Moehlmann, Moisburg (DE); Jan-Peter Schat, Hamburg (DE); Tim Lauber, Aachen (DE)

(73) Assignee: NXP B.V., Eindhoven (NL)

( * ) Notice: Subject to any disclaimer, the term of this patent is extended or adjusted under 35 U.S.C. 154(b) by 484 days.

(21) Appl. No.: 17/451,567

(22) Filed: Oct. 20, 2021

(65) Prior Publication Data

US 2022/0187423 A1  Jun. 16, 2022

(30) Foreign Application Priority Data

Dec. 11, 2020  (EP) ..................................... 20213446

(51) Int. Cl.
*H03L 7/099*  (2006.01)
*H03L 7/093*  (2006.01)

(52) U.S. Cl.
CPC ............ *H03L 7/0991* (2013.01); *H03L 7/093* (2013.01)

(58) Field of Classification Search
CPC .............................. H03L 7/0991; H03L 7/093
See application file for complete search history.

(56) References Cited

U.S. PATENT DOCUMENTS

| | | | |
|---|---|---|---|
| 5,400,364 A * | 3/1995 | Yada | ........................ H03M 5/18 |
| 6,262,634 B1 | 7/2001 | Flanagan et al. | |
| 6,560,503 B1 | 5/2003 | Toprac et al. | |
| 9,831,880 B1 * | 11/2017 | Kuan | ....................... H03L 7/093 |
| 10,382,045 B2 * | 8/2019 | Moehlmann | ............... H03L 7/12 |
| 10,396,974 B1 | 8/2019 | Schat et al. | |
| 10,826,505 B1 * | 11/2020 | Moehlmann | ............ H03L 7/087 |
| 10,848,164 B1 * | 11/2020 | Wen | ....................... H03L 7/1974 |
| 11,070,216 B2 * | 7/2021 | Candler | .................. H03L 7/085 |

(Continued)

FOREIGN PATENT DOCUMENTS

| CN | 104378106 A | 3/2017 | |
|---|---|---|---|
| CN | 114624563 A * | 6/2022 | ............. G01R 17/02 |

(Continued)

OTHER PUBLICATIONS

Beohar, N., "Disturbance-free BIST for Loop Characterization of DC-DC Buck Converters", 2015 IEEE 33rd VLSI Test Symposium, pp. 1-6, Apr. 27-29, 2015.

(Continued)

*Primary Examiner* — Adam D Houston (57) ABSTRACT

The disclosure relates to monitoring of feedback systems such as phase lock loops. A system is disclosed, comprising: a feedback circuit (100); and a monitoring module (190). The monitoring module (190) is configured to: i) receive actual values of at least one state variable describing the state of the feedback circuit at a first time; ii) determine a predicted future value of the at least one state variable at a second time from the actual values at the first time using a model of the feedback circuit; iii) receive actual values of the at least one state variable at the second time; iv) compare the predicted future value of the at least one state variable at the second time with the actual value of the at least one state variable at the second time; and v) determine whether the feedback circuit has a fault condition, depending on the results of step iv).

20 Claims, 4 Drawing Sheets

(56) References Cited

U.S. PATENT DOCUMENTS

| | | | |
|---|---|---|---|
| 2004/0125481 A1* | 7/2004 | Ehrlich | G11B 5/59688 |
| | | | 360/77.08 |
| 2005/0063087 A1* | 3/2005 | Ehrlich | G11B 5/59633 |
| | | | 360/77.08 |
| 2006/0186871 A1 | 8/2006 | Pakbaz et al. | |
| 2010/0322345 A1 | 12/2010 | Plevridis | |
| 2012/0056654 A1* | 3/2012 | Lee | H03L 7/0995 |
| | | | 327/159 |
| 2015/0100165 A1 | 4/2015 | Federspiel et al. | |
| 2015/0200676 A1* | 7/2015 | Ainspan | H03L 7/099 |
| | | | 327/159 |
| 2015/0200677 A1* | 7/2015 | Ainspan | H03L 7/1974 |
| | | | 327/158 |
| 2016/0079989 A1* | 3/2016 | Ainspan | H03L 7/0992 |
| | | | 327/156 |
| 2017/0194973 A1* | 7/2017 | Moehlmann | H03L 7/093 |
| 2017/0371990 A1* | 12/2017 | Wiklund | H04W 88/02 |
| 2018/0138916 A1* | 5/2018 | Jenkins | H03L 7/085 |
| 2019/0356324 A1* | 11/2019 | Jenkins | H03L 7/1972 |
| 2021/0273644 A1* | 9/2021 | Wen | H03L 7/107 |
| 2023/0403017 A1* | 12/2023 | Zanchi | H03L 7/085 |

FOREIGN PATENT DOCUMENTS

| | | | | |
|---|---|---|---|---|
| EP | 2804324 A1 | * | 11/2014 | ............ H03L 7/093 |
| GB | 2387662 A | | 10/2003 | |
| JP | H113120 A | | 3/1989 | |
| JP | H11268692 A | | 10/1999 | |

OTHER PUBLICATIONS

Gierschner, M., "Influence of Dynamic Misorientation of PLL for Small-Signal Analysis of Converter Control in Weak Grids", 2018 20th European Conference on Power Electronics and Applications (EPE'18 ECCE Europe), Sep. 17-21, 2018.

Namgoong, W., "Observer-Controller Digital PLL", IEEE Transactions on Circuits and Systems—I: Regular Papers, vol. 57, No. 3, Mar. 2010.

Sharkia, A., "A Compact, Voltage-Mode Type-I PLL With Gain-Boosted Saturated PFD and Synchronous Peak Tracking Loop Filter", IEEE Transactions on Circuits and Systems'I: Regular Papers, vol. 66, No. 1, Jan. 2019.

Wang, Z., "Verification of Analog and Mixed Signal Designs using Online Monitoring", 2009 IEEE 15th International Mixed-Signals, Sensors, and Systems Test Workshop, Jun. 10-12, 2009.

* cited by examiner

FEEDBACK SYSTEM MONITORING

CROSS-REFERENCE TO RELATED APPLICATIONS

This application claims the priority under 35 U.S.C. § 119 of European Patent application no. 20213446.6, filed on 11 Dec. 2020, the contents of which are incorporated by reference herein.

FIELD

The disclosure relates to monitoring of feedback systems such as phase lock loops.

BACKGROUND

The failure rate of modern CMOS ICs (complementary metal oxide semiconductor integrated circuits) in the field is often a serious concern, especially in safety-critical applications. Significant contributors to the failure rate are latent defects that are activated during lifetime, and aging mechanisms like NBTI (negative bias temperature instability), HCI (hot carrier injection) and TDDB (time dependent dielectric breakdown). Also incidents like voltage spikes in a thunderstorm or customer mishandling are relevant causes of IC failures in the field. An example is ESD (electrostatic discharge) overstress during maintenance or repair.

Often, a partial, i.e. parametric failure can give rise to more severe problems than a complete failure. A complete failure can mostly be immediately recognized and counteracted, while a parametric failure may lead to safety risks, in form of too late detection of hazards or of false alerts.

Such hazards can be caused by unpredictable issues in the environment of the system like brown out, lightning or electrical discharge caused by engines etc. that cause disturbances of the system.

In order to mitigate these risks, built in self-test (BIST) can be implemented to test sensitive circuit blocks in the field.

Automotive safety standards like ISO 26262 require a certain failure in time (FIT) level to be kept, i.e. the number of safety-critical failures per $10^9$ operating hours may not exceed a certain limit. IC (integrated circuit) manufacturers often must prove to their customers that their systems meet a FIT level, which may be specified as a system requirement. Such proof may be based on process reliability data (that shows how many defects will occur over a product lifetime) and data of the functional safety concept (that show how many of these defects are safety-critical, and how many of the safety-critical defects can/will be mitigated by functional safety measures).

The limit for safety-critical defects is often very tight: e.g. 100 FIT for automotive safety integrity level (ASIL) B and 10 FIT for ASIL D. These rates refer to a complete system, with the result that an IC comprised in the system may be required to have only a fraction of this failure rate. In the example of a car radar IC, the maximum allowed failure rate may as little as 2 FIT.

These challenging reliability requirements often mandate regular self-tests in the field. Often detection times need to be short. Depending on the application, detection times shorter than 1 microsecond may be expected/required.

Phase lock loops (PLL) are often subject to stringent reliability requirements, because a marginal worsening of PLL parameters may have critical consequences. For example, some potential consequences of increased jitter are:

In case the PLL drives a high-speed interface, increase of PLL jitter will lead to an increase of transmission errors (BER, Bit Error Rate). This may lead to sporadic failures of the system.

In case the PLL drives a timing-critical digital circuit, the rate of setup violations will increase in those cycles that are, due to the jitter, shorter than the nominal cycle time. Also this may lead to sporadic system failures.

In case the PLL drives an analog/mixed-signal circuit, e.g. a mixer to down-convert a received RF signal, the signal quality will be directly affected, which may lead e.g. to sensitivity issues or in case of spurious tones which effect the adjacent channel performance.

SUMMARY

According to a first aspect there is provided a method of automatically monitoring performance of a feedback circuit, comprising:

i) receiving actual values of at least one state variable describing the state of the feedback circuit at a first time;

ii) determining a predicted future value of the at least one state variable at a second time from the actual values at the first time using a model of the feedback circuit;

iii) comparing the predicted future value of the at least one state variable with actual values of the at least one state variable at the second time; and iv) determining whether the feedback circuit has a fault condition, depending on the results of step iii).

Step iii) may comprise determining an error for each state variable as a difference between the predicted future value and the actual value at the second time, and step iv) may comprise comparing the error with a predefined error margin for the at least one state variable, and determining that there is no fault condition if the error is within the error margin.

The time difference between the first time and the second time may be between 0.1 and 10 microseconds. The time difference between the first time and the second time may be more than 10 microseconds. The time difference between the first time and the second time may be more than 100 microseconds.

The method may comprise repeating steps i) to iii) for different time steps, and step iv) may depend on the results of multiple comparisons between the predicted values at the second time and the actual values at the second time.

The different times may each be separated by the same time difference as the first time and the second time (i.e. there may be a fixed time step).

The method may comprise incrementing a counter each time the error exceeds the error margin and determining that the feedback circuit has a fault condition when the counter exceeds a threshold value.

The method may comprise decrementing the counter each time the error is within the error margin.

Each decrement to the counter may be smaller than each increment to the counter (so that the counter has a faster rate of increase per time step with error exceeding the error margin than the counter decays per time step with error within the error margins). For example, the increment of the counter per time step with error exceeding the error margin may be 5, and the decrement of the counter per time step with error within the error margin may be 1.

The feedback circuit may comprise a phase lock loop or PLL. The PLL may comprise: a phase detector, a loop filter and a digitally (or voltage) controlled oscillator. The phase lock loop may be part of a safety critical system. The phase lock loop may be part of a vehicle (e.g. automotive) radar system.

The phase detector may determine a phase error $\varphi$. The loop filter may comprise an integrator having an integrator output value X.

The one or more state variables may comprise (or consist of) the phase error $\varphi$ and the integrator output value X (e.g. of the loop filter).

The predicted future value of the at least one state variable may be determined in dependence on at least one of (e.g. all of): a frequency control word, a reference frequency, an integral loop filter factor, a proportional loop filter factor, a real oscillator gain (df/dV), a predicted oscillator slope, and a zero input frequency value.

A predicted future value of the phase error $\varphi'$ may be determined using the following expression:

$$\varphi' = FCW \cdot f_{Ref} - f_{0,Osc} - f_{Ref} \cdot \frac{K_{DCO}}{K_{nDCO}} \cdot (\varphi \cdot kp + X)$$

where FCW is the frequency control word, $f_{Ref}$ is the reference frequency, $f_{0,Osc}$ is the zero input frequency of the oscillator, $K_{DCO}$ is the real oscillator gain, $K_{nDCO}$ is the predicted oscillator gain, kp is the proportional loop filter factor, X is the current integrator output value and $\varphi$ is the current phase error.

A predicted future value of the integrator output X' may be determined using the following expression:

$$X' = \varphi \cdot ki \cdot f_{Ref}$$

where ki is the integral loop filter factor.

The model may comprise feedback circuit parameters (such as, in the case of a PLL, FCW, $f_{Ref}$, $f_{0,Osc}$, $K_{DCO}$, $K_{nDCO}$, kp, and ki) and at least some of the feedback circuit parameters may be updated periodically. The value of at least some of the feedback circuit parameters may be updated based on the actual state variables.

For example, the value of the real oscillator gain $K_{DCO}$ may be updated periodically. The value of the real oscillator gain $K_{DCO}$ may be updated based on the actual state variables.

The method may comprise providing an error signal indicating that the feedback circuit has a fault condition, in response to determining that the feedback circuit has a fault condition.

The method may comprise testing of monitoring of the feedback circuit, by injecting a fault into the model, and checking whether a fault condition is indicated in response.

The method may comprise injecting a fault into the system and monitoring the response. Injecting a fault may comprise imposing a step on at least one of the state variables. The response of the feedback circuit, evaluated by monitoring the state variables, may be used to determine or update one or more circuit parameters.

According to a second aspect, there is provided a system comprising:
 a feedback circuit; and
 a monitoring module configured to:
 i) receive actual values of at least one state variable describing the state of the feedback circuit at a first time;
 ii) determine a predicted value of the at least one state variable at a second time from the actual values at the first time using a model of the feedback circuit;
 iii) receive actual values of the at least one state variable at the second time;
 iv) compare the predicted value of the at least one state variable at the second time with the actual value of the at least one state variable at the second time;
 v) determine whether the feedback circuit has a fault condition, depending on the results of step iv).

The monitoring module may be a processor, and the model may be implemented in software. In other embodiments the monitoring module may implement the model of the feedback circuit in hardware.

The feedback circuit according to the second aspect may include features described with reference to the first aspect, including optional features thereof. For example, the feedback circuit may comprise a phase lock loop, etc.

According to a second aspect, there is provided a vehicle radar system comprising the feedback circuit of the second aspect. The radar system may include any of the optional features of the second aspect (including, by reference, features described with reference to the first aspect).

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

Figure 1:
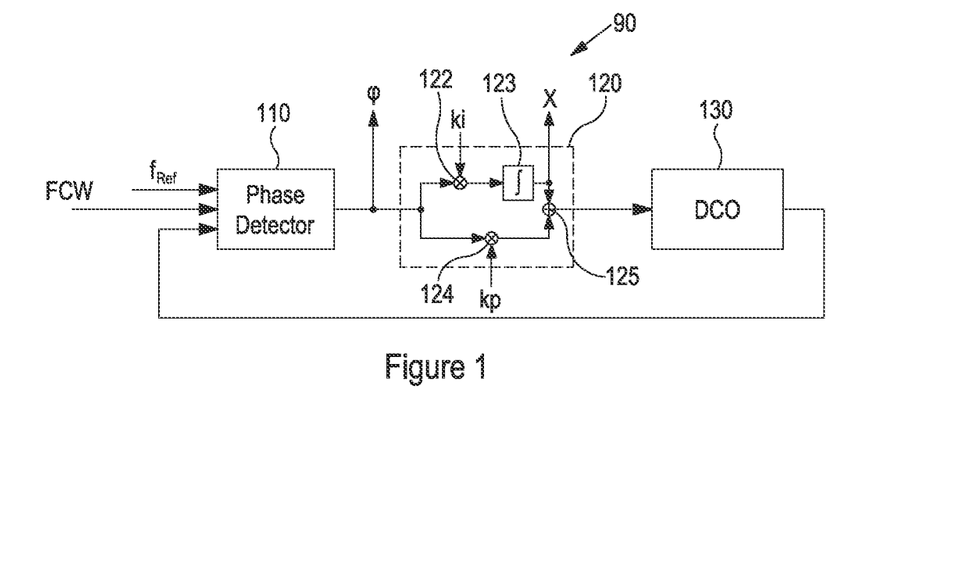
FIG. 1 illustrates a first order phase lock loop block diagram.

FIG. 1 is a block diagram of a phase lock loop 90 (which may be an all-digital phase lock loop), comprising a phase detector 110, loop filter 120 and digitally controlled oscillator 130.

The phase detector 110 receives a frequency control word FCW, a reference frequency $f_{ref}$ and the output from the DCO 130. The phase detector 110 outputs a phase error $\varphi$.

The loop filter 120 receives the phase error $\varphi$ and performs a filtering operation to determine an input to the DCO 130. The loop filter 120 in this example comprises a proportional path in which the phase error is multiplied (at 124) by a proportional gain factor kp, and an integral path in which the phase error is multiplied (at 122) by an integral gain factor ki and the result integrated (at 123) to determine X, the integrator output value. The proportional and integral paths are summed (at 125) to determine the output of the loop filter 120.

The output from the loop filter 120 is provided to the DCO 130 to control the frequency output from the DCO 130.

Figure 2:
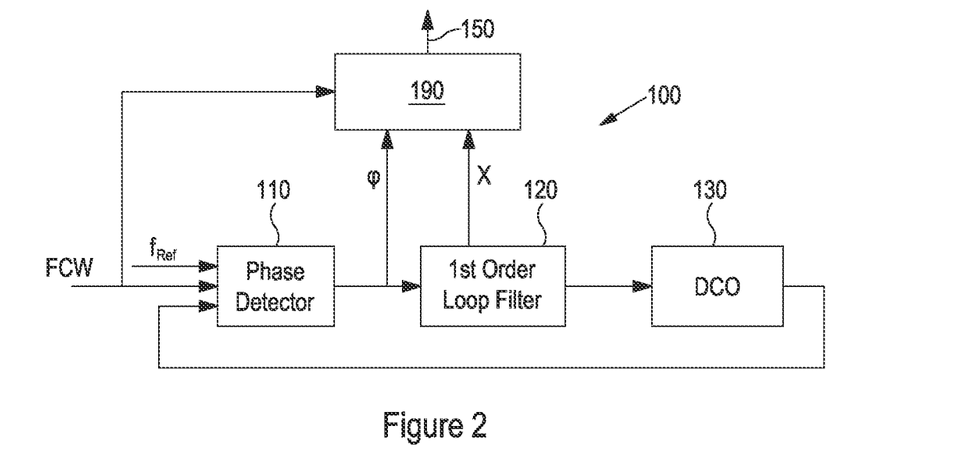
FIG. 2 illustrates an embodiment of the invention, in which a processor determines whether phase lock loop is operating properly, based on a state variable model.

Referring to FIG. 2, a system 100 according to an embodiment is shown, comprising a PLL. The PLL comprises a phase detector 110, loop filter 120 and DCO 130, which work in the same way as described with reference to FIG. 1. In addition, the system 100 comprises a monitoring module 190.

The monitoring module 190 receives state variables that indicate the state of the phase lock loop 100, and implements a model to predict a future state of the phase lock loop 100. In this example the state variables of the PLL 100 are the phase error $\varphi$ and the integrator output value X, but it will be understood that, in other feedback circuits, other state variables can be used (and the invention is not limited solely to phase lock loops).

In general, a system that can be described by coupled first-order differential equations can be modelled using state-variables. The evolution of a vector of state variables in a discrete time system is described by:

$$x[n+1]=Ax[n]+Bu[n]$$

where the current state at time step n is x[n], u[n] represents inputs to the system and A and B are coefficient matrices.

In an example case of a PLL like that shown in FIG. 2, the state variable equations can be written as:

$$\begin{pmatrix} X' \\ \varphi' \end{pmatrix} = f(X, \varphi, SystemParam, \text{Input})$$

where X' is the integrator output value at the next time step, $\varphi'$ is the phase error at the next time step, X is the integrator output value at the current time step, $\varphi$ is the phase error at the current time step, SystemParam is the parameters of the phase lock loop (e.g. integral gain factor etc) and Input is the values of any inputs to the phase lock loop.

With constant input frequency $f_{Ref}$, constant system parameters like FCW and loop filter settings (e.g. proportional and integral gain factors), the state variable model can be written as:

$$\begin{pmatrix} X' \\ \varphi' \end{pmatrix} = \begin{pmatrix} \varphi \cdot ki \cdot f_{Ref} \\ FCW \cdot f_{Ref} - f_{0,Osc} - f_{Ref} \cdot \frac{K_{DCO}}{K_{nDCO}} \cdot (\varphi \cdot kp + X) \end{pmatrix}$$

where FCW is the frequency control word, $f_{Ref}$ is the reference frequency, $f_{0,Osc}$ is the zero input frequency of the oscillator, $K_{DCO}$ is the real oscillator gain, $K_{nDCO}$ is the predicted, estimated or typical oscillator gain and kp is the integral loop filter factor.

The monitoring module 190 may implement a model similar to that described above, and determine predicted future values for the state variables that describe the state of the PLL. At the next time step the predicted future values can be compared with actual values of the state variables. The difference between the predicted values of the state variables and the actual values provides an error, which can be used to decide whether the PLL has a fault condition or not. For example, an error margin can be defined (for each state space variable, or as weighted sum of the errors in each state variable) and errors that exceed the error margin can, under specific circumstances, indicate a fault condition.

In some embodiments, for example in an all-digital phase lock loop, the state variables of the circuit may be digital, which makes them straightforward to sample and use in a model without any effect on the operation of the PLL. The model may operate in the digital domain, and be implemented in hardware or software.

Figure 3:
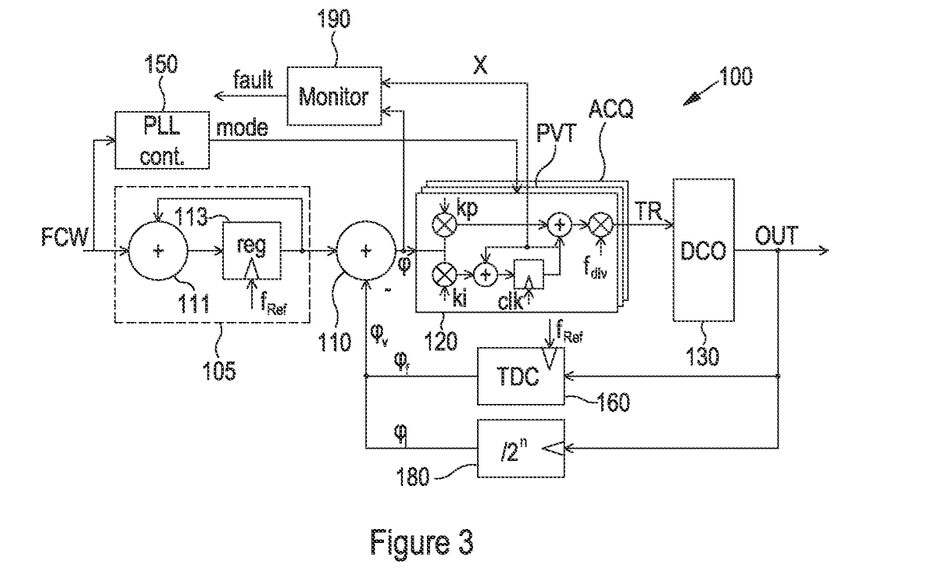
FIG. 3 is a schematic flow chart of a method according to an embodiment.

FIG. 3 shows a block diagram of an all-digital PLL 100 according to an embodiment. The PLL 100 comprises a reference phase generator 105, phase detector 110, loop filter 120, digitally controlled oscillator (DCO) 130, control block 150, time to digital converter (TDC) 160, feedback divider 180, and monitoring module 190.

The reference phase generator 105 comprises an adder 111 and register 113, arranged to integrate an input frequency control word FCW, and thereby provide a reference phase ramp $\varphi_{ref}$.

The phase detector 110 compares the reference phase ramp $\varphi_{ref}$ with a feedback ramp $\varphi_v$ derived from the output of the DCO 130, and outputs a phase error signal $\varphi$. The feedback ramp $\varphi_v$ is determined by combining (e.g. by fixed point concatenation) the output from the feedback divider 180 and the TDC 160.

The loop filter 120 receives the phase error signal $\varphi$, and performs a filtering operation. The loop filter 120 in this example is controlled by a control block 150, which may vary the configuration of the loop filter 120 (e.g. depending on the set FCW, and the loop state). The control block 150 may for example provide proportional gain $k_p$ and integral gain parameters $k_i$ to the loop filter 120.

The loop filter 120 may provide three output signals for controlling the DCO 130, these being a process voltage temperature control signal PVT, an acquisition control signal ACQ, and a tracking signal TR. In the example embodiment, only the TR signal is shown. Each of these control signals may control a switched capacitor bank of the DCO 130, so as to vary the output frequency of the DCO 130. In alternative arrangements a voltage controlled oscillator may be used, comprising a digital to analog converter and a varactor.

The output from the DCO 130 is received by the feedback divider 180 and the TDC 160. The TDC 160 measures and quantizes the timing difference between transitions of the reference frequency $f_{ref}$ and the transitions of the ADPLL output signal. The feedback divider 180 accumulates a count of the transitions in the output of the PLL and is sampled each reference period. The output $\varphi_f$ from the TDC 160 is combined with the output $\varphi_i$ from the feedback register 180, for instance by concatenation. As an illustrative example, the output from the DCO 130 may have a frequency of ~5 GHz. So the period of the DCO is 200 ps. The TDC allows a resolution higher than DCO period (e.g. <100 ps). The resolution depends on the architecture of the TDC.

In this example the phase error $\varphi$ and integrator output X are both digital, which makes it straightforward to implement a model using these as input parameters (either with hardware or software running on a processor). For analog state variables, an analog computer may be used to implement the model, or an analog to digital convertor may be used to digitise the state variables to enable the model to be calculated in the digital domain.

The monitoring module 190 receives the state variables $\varphi$ and X and determines whether the PLL has a fault condition.

The monitoring module may be configured to implement the method described with reference to FIG. 4 and any aspects of methods described herein.

Figure 4:
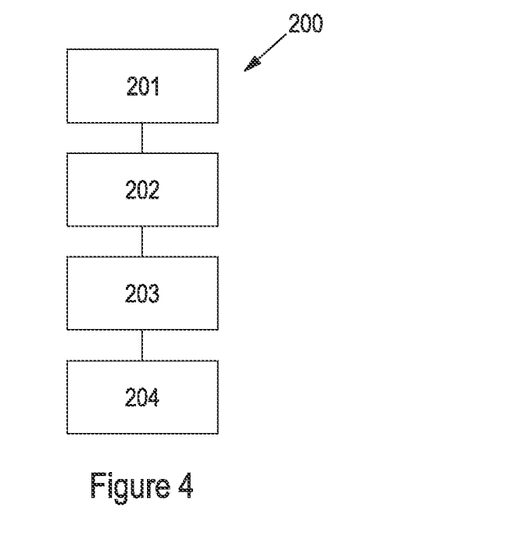
FIG. 4 is a plot of simulation data illustrating the operation of an example embodiment with a matched model.

FIG. 4 shows an example of a method according to an embodiment, comprising steps 201 to 204.

Step 201 comprises receiving, at a first time, actual values of at least one state variable (e.g. phase error $\varphi_{a1}$ and the integrator output value $X_{a1}$) describing the state of a feedback circuit (e.g. a PLL).

Step 202 comprises using a model of the feedback circuit to determine, from the actual values of state variables at the first time ($\varphi_{a1}$, $X_{a1}$), a predicted value for the values of each of the state variables at a second time ($\varphi_{p2}$, $X_{p2}$).

Step 203 comprises comparing the predicted values of the state variables at the second time ($\varphi_{p2}$, $X_{p2}$) with actual values of the state variables at the second time ($\varphi_{a2}$, $X_{a2}$). Generalising the one or more state variables to a vector of state variables SV, denoting actual values with subscript a and predicted values with subscript p, and times with subscript numerals, we can determine a vector of state errors for the current step n as:

$$\text{error}_n = SV_{an} - SV_{pn}$$

Step 204 comprises determining, from the results of step 203, whether the feedback circuit has a fault condition. For example, the error may be compared with an acceptable error margin that defines a vector of maximum "non-fault" errors in each state variable, with a fault condition indicated if the error for any state variable exceeds the error margin. In other embodiments a weighted sum of the error vector may be compared with a threshold value, or some other approach used.

In some embodiments, a single out-of-margin error may result in signalling of a fault condition. In other embodiments, more than one out-of-margin error may be required to indicate a fault condition. More complicated statistical thresholds may be used for indicating fault conditions, as described in more detail below.

Figure 5:
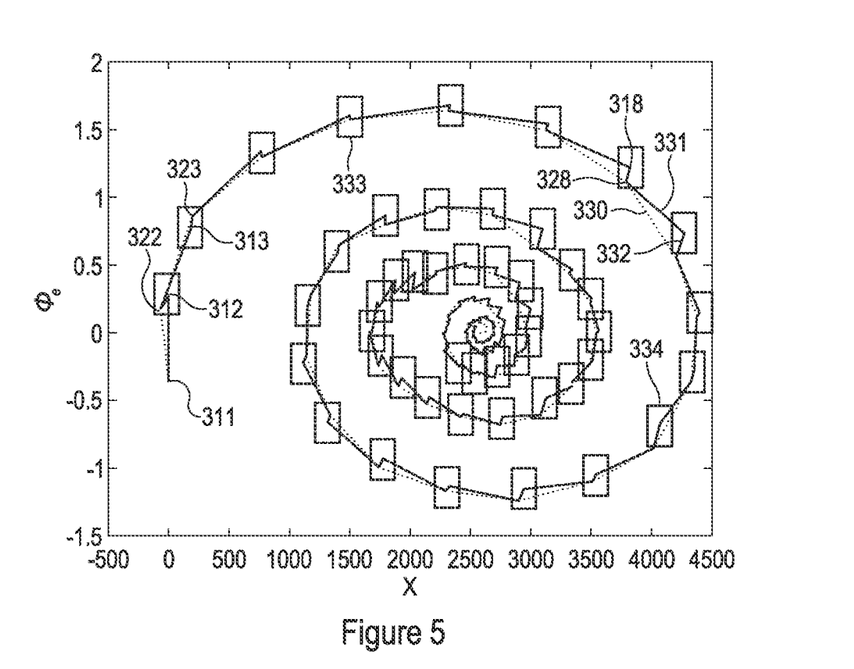
FIG. 5 is a plot of simulation data illustrating the operation of an example embodiment with a mismatch between the model and PLL.

FIG. 5 shows example results obtained from simulation (including noise sources e.g. phase noise of the reference signal and phase noise the DCO signal) of a PLL like that shown in FIGS. 2 and 3. The simulation is started with initial values of the state variables corresponding to the left middle part of the diagram, at 311. The PLL starts settling (i.e. the loop filter adjusts the DCO control voltage to cause the DCO output to be at the correct frequency, corresponding to the input reference frequency and the frequency control word, which is fixed in this example). In the example of FIG. 5, the model and the simulation have the same system parameters (representing a no-fault condition).

At each step, the model makes a prediction of the next values of the state variables. Subsequent to step 311, the predicted state variable values 322 are shown, along with the actual state variables 312. Subsequent to the actual state variable values 312, the predicted state variable values 323 are shown, with the actual state variables 313. The error margin 333 at each step is shown as a box, with a solid line box 334 shown for errors that are larger than the error margin and a dashed line where the error is smaller than the error margin. A dotted vector 330 from each actual state variable value to a subsequent actual state variable value is shown, along with a dashed vector 331 from each actual state variable value to a subsequent predicted state variable, and a solid error vector 332 from the predicted state variable to the actual state variable at each time step.

The predicted state variables from the model predict the actual state of the simulation very closely, which is to be expected since this is a simulation of an operational state that is free from faults. There are two instances of the error exceeding the error margin. In order to avoid triggering false error conditions, the error margin could be increased, or a statistical threshold may be required to trigger an indication of a fault condition.

When the system is settled (after the spiral converges) the direction of changes is essentially random and mainly determined by noise. In order not to generate too many false alerts (e.g. during system settling), the error threshold may be adaptive, so that the error threshold is larger during settling and smaller once the system has settled. One way to do this is to modify the error margin in response to detection of lock (there are many known ways to detect that a phase lock loop is in a lock condition).

Once the phase lock loop has settled, the state variables should not exceed the error margin that is defined in FIG. 5. An error exceeding the error margin can only happen from a lock state by some disturbance e.g. single event upset (SEU) or if the system alters e.g. by aging.

Figure 6:
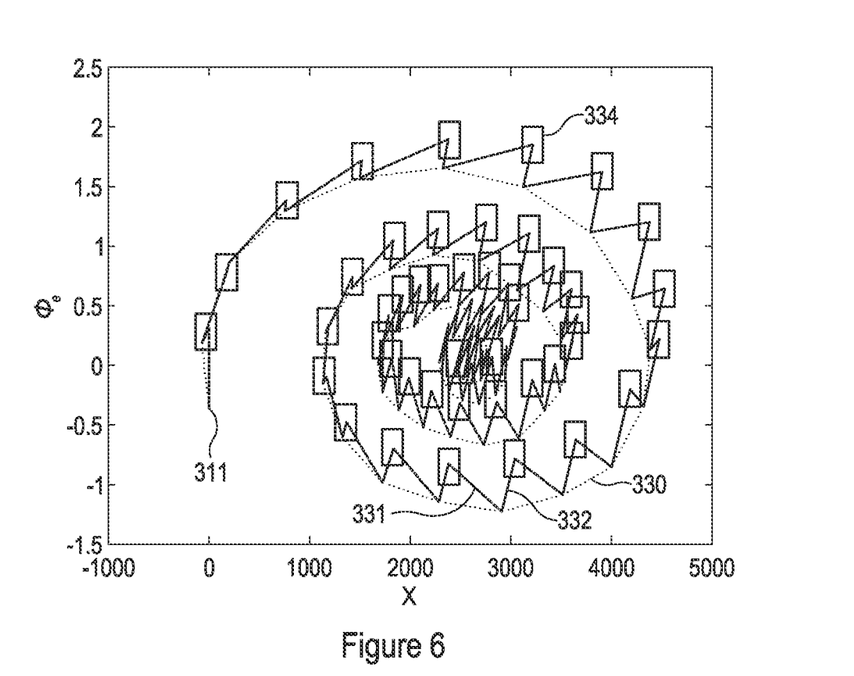
FIGS. 6, 7, and 8 are plots of showing different schemes for accumulating errors to determine a fault condition.

FIG. 6 shows further simulation results, in which the integral gain factor (ki) in the model is a factor of 2 different from the simulation. This is representative of an error in the system, resulting in a mismatch between the system and the model. The model no longer predicts the subsequent state of the model well and there are many consecutive steps where the error exceeds the error margin. Similar effects can be observed for all the state variables (with a mismatch between the real system and the model resulting in errors regularly exceeding the error margin).

Methods and systems according to this disclosure may not require any complex processing and do not disturb system operation. They can therefore operate to diagnose any system faults very rapidly and without interrupting the operation of the system that they are monitoring. Both of these may be very useful in the context of safety critical systems.

In addition to passive monitoring, in certain embodiments, a step change may be imposed on a state variable and the response observed. This may be done, for example, while the system is in an idle mode, so as not to disturb the functioning of an active device. This can be used to determine feedback system parameters (such as the real oscillator slope $K_{DCO}$).

Furthermore, the functionality of the monitoring module 190 may be tested. One way to achieve this is by a soft-fault injection mechanism, in which an error is introduced into the model (e.g. in the example PLL system, the value of the integral/proportional gain factor could be modified by a factor of 2, or the oscillator slope etc). It can be expected that the introduction of such an error in the model will lead to error above the error margin, leading to the identification of a fault state by the monitoring module 190. In this way, the functioning of the monitoring module 190 can be tested without disrupting the functioning of the system that is being monitored.

The monitoring approach disclosed herein may be adapted to different safety relevant systems, while being easy to implement and not resource hungry. The sample time and error margin are straightforward to adapt for different applications.

In addition to relatively static systems (e.g. with a constant FCW) dynamically changing systems can also be monitored (and the model expanded to receive any dynamic inputs, consistent with the general approach for state variable modelling). Examples of parameters that may be dynamic are parameters of the loop filter (e.g. ki and kp), which may be modified during lock, tuning of the system or during chirp generation. The monitoring approach described herein may also be applied to non-linear systems, such as band-bang mode PLLs.

As already discussed, a single error that exceeds an error margin may not be sufficient to determine an error state. How such events are filtered depends on the application. For a PLL in a tuner application in the analogue radio domain single event and rare events may not be that severe and a significant accumulation of errors exceeding the threshold may be required to trigger a fault condition. In a high speed serial interface PLL application a single error can cause bit errors, which may mean that monitoring should be more stringent.

If the detection of single error events is important, an error condition flag may be set directly by a single error exceeding the error margin. The detection of faults may be relaxed by counting (or integrating) instances of error events (the error exceeding the error margin). The counter may include saturation so that each error event increments the counter and each time step without an error event decrements the counter. In some embodiments an error event may increment the counter more than the decrement from a step without an error event. A threshold for the counter may define a fault condition. The error event increment and decrement values may be tuned to optimise the monitoring system for appropriate sensitivity and specificity.

Figure 7:
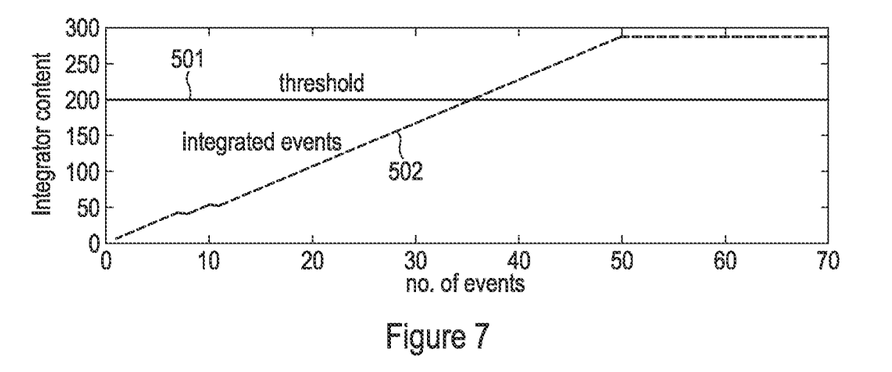

FIG. 7 shows an example in which the threshold 501 of the error event counter (indicating a fault condition) is set at 200, and each error event results in the error event counter 502 incrementing by 6. When no error event is detected, the error event counter does not decrement. With this approach an accumulation of error events will eventually trigger a fault condition.

Figure 8:
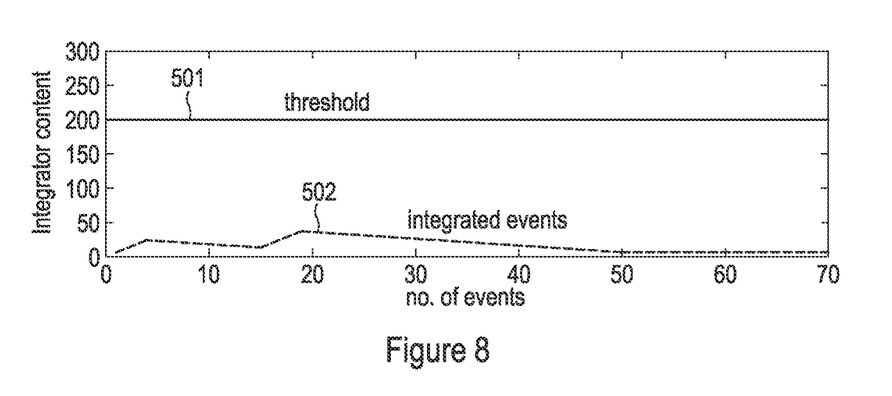

FIG. 8 shows an alternative approach, in which an error event again results in an increment of 6 on the counter 502, but in which a step with no error event results in a decrement of the counter by 1. According to this approach, a relatively small number of infrequent errors will not trigger indication of a fault condition, but recurrence of a fault with sufficient frequency will result in indication of a fault condition. The threshold 501 is again set at 200.

Although example counter increments of 6 has been used, other values are possible (e.g. 1 to 10). Similarly, the decrement may have any appropriate value. The decrement value may be smaller than the increment value, but this is not essential.

From reading the present disclosure, other variations and modifications will be apparent to the skilled person. Such variations and modifications may involve equivalent and other features which are already known in the art of phase lock loops, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A method of automatically monitoring performance of a feedback circuit, comprising:
   i) receiving actual values of at least one state variable describing the state of the feedback circuit at a first time;
   ii) determining a predicted future value of the at least one state variable at a second time from the actual values at the first time using a model of the feedback circuit;
   iii) comparing the predicted future value of the at least one state variable with actual values of the at least one state variable at the second time; and
   iv) determining whether the feedback circuit has a fault condition, depending on the results of step iii).

2. The method of claim 1, wherein step iii) comprises determining an error for each state variable as a difference between the predicted future value and the actual value at the second time, and step iv) comprises comparing the error with a predefined error margin for the at least one state variable, and determining that there is no fault condition if the error is within the error margin.

3. The method of claim 1, further comprising repeating steps i) to iii) for different time steps, wherein step iv) depends on the results of multiple comparisons between the predicted values at the second time and the actual values at the second time.

4. The method of claim 3, further comprising incrementing a counter each time the error exceeds the error margin, and determining that the feedback circuit has a fault condition when the counter exceeds a threshold value.

5. The method of claim 4, further comprising decrementing the counter each time the error is within the error margin.

6. The method of claim 5, wherein the decrement value is smaller than the increment value.

7. The method of claim 1, wherein the feedback circuit is a phase lock loop comprising: a phase detector, a loop filter and a digitally controlled oscillator.

8. The method of claim 7, wherein the phase detector determines a phase error $\varphi$ and the loop filter comprises an integrator having an integrator output value X, and the one or more state variables comprise, or consist of, the phase error $\varphi$ and the integrator output value X.

9. The method of claim 8, wherein the predicted future value of the at least one state variable is determined in dependence on at least one of: a frequency control word, a reference frequency, an integral loop filter factor, a proportional loop filter factor, a real oscillator slope, a predicted oscillator gain, and a zero input frequency value.

10. The method of claim 1, wherein the model comprises feedback circuit parameters, and the feedback circuit parameters are updated periodically.

11. The method of claim 1, further comprises testing of monitoring of the feedback circuit by injecting a fault into the model, and checking whether a fault condition is indicated in response.

12. The method of claim 1, further comprises injecting a fault into the feedback circuit and monitoring the response via the state variables, and determining or updating at least one feedback circuit parameter based on the response of the feedback circuit to the injected fault.

13. A system comprising:
a feedback circuit; and
a monitoring module configured to:
  i) receive actual values of at least one state variable describing the state of the feedback circuit at a first time;
  ii) determine a predicted future value of the at least one state variable at a second time from the actual values at the first time using a model of the feedback circuit;
  iii) receive actual values of the at least one state variable at the second time;
  iv) compare the predicted future value of the at least one state variable at the second time with the actual value of the at least one state variable at the second time;
  v) determine whether the feedback circuit has a fault condition, depending on the results of step iv).

14. The system of claim 13, wherein the monitoring module is configured to implement the method of claim 13.

15. A vehicle radar system, comprising a phase lock loop, the phase lock loop including:
a feedback circuit; and
a monitoring module configured to:
  i) receive actual values of at least one state variable describing the state of the feedback circuit at a first time;
  ii) determine a predicted future value of the at least one state variable at a second time from the actual values at the first time using a model of the feedback circuit;
  iii) receive actual values of the at least one state variable at the second time;
  iv) compare the predicted future value of the at least one state variable at the second time with the actual value of the at least one state variable at the second time;
  v) determine whether the feedback circuit has a fault condition, depending on the results of step iv).

16. The vehicle radar system of claim 15, wherein step iii) comprises determining an error for each state variable as a difference between the predicted future value and the actual value at the second time, and step iv) comprises comparing the error with a predefined error margin for the at least one state variable, and determining that there is no fault condition if the error is within the error margin.

17. The vehicle radar system of claim 16, wherein the monitoring module is further configured to increment a counter each time the error exceeds the predetermined error margin, and determining that the feedback circuit has a fault condition when the counter exceeds a threshold value.

18. The vehicle radar system of claim 15, wherein the phase lock loop further includes a phase detector, a loop filter and a digitally controlled oscillator.

19. The vehicle radar system of claim 15, wherein the monitoring module is further configured to test the feedback circuit by injecting a fault into the model, and checking whether a fault condition is indicated in response.

20. The vehicle radar system of claim 15, wherein the monitoring module is further configured to inject a fault into the feedback circuit and monitor the response via the state variables, and determine or update at least one feedback circuit parameter based on the response of the feedback circuit to the injected fault.

* * * * *